United States Patent
Li et al.

(10) Patent No.: US 10,126,392 B2
(45) Date of Patent: Nov. 13, 2018

(54) MAGNETIC RESONANCE IMAGING METHOD AND MAGNETIC RESONANCE IMAGING APPARATUS THAT COMPENSATE FOR SLAB DISTORTION BY SELECTIVE SLAB THICKNESS EXPANSION

(71) Applicant: Siemens Healthcare GmbH, Erlangen (DE)

(72) Inventors: Guo Bin Li, Freiburg (DE); Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 1442 days.

(21) Appl. No.: 13/721,646

(22) Filed: Dec. 20, 2012

(65) Prior Publication Data
US 2013/0169275 A1    Jul. 4, 2013

(30) Foreign Application Priority Data
Dec. 30, 2011 (CN) .......................... 2011 1 0454045

(51) Int. Cl.
  *G01R 33/48* (2006.01)
  *G01R 33/565* (2006.01)
  *G01R 33/561* (2006.01)

(52) U.S. Cl.
  CPC ... *G01R 33/4818* (2013.01); *G01R 33/56563* (2013.01); *G01R 33/4822* (2013.01); *G01R 33/5617* (2013.01)

(58) Field of Classification Search
  USPC ........ 324/300–322; 600/407–435; 128/653.3
  See application file for complete search history.

(56) References Cited

U.S. PATENT DOCUMENTS 5,544,653 A * 8/1996 Takahashi .......... G01R 33/4835
                                                324/309
6,008,647 A * 12/1999 Zhou ................ G01R 33/56581
                                                324/309
(Continued)

FOREIGN PATENT DOCUMENTS

CN     1165646 A    11/1997
CN     1820208 A     8/2006
(Continued)

OTHER PUBLICATIONS

Cho Z, Kim D, Kim Y Total inhomogeneity correction including chemical shifts and susceptibility by view angle tilting Med Phys 1988, 15 7-11.
(Continued)

*Primary Examiner* — Melissa Koval
*Assistant Examiner* — Tiffany Fetzner
(74) *Attorney, Agent, or Firm* — Schiff Hardin LLP (57) ABSTRACT

A magnetic resonance imaging method and imaging device are disclosed. The magnetic resonance imaging method includes dividing the current slab of an imaging region into an initial number of detection sub-slabs, and expanding the encoded thickness of each detection sub-slab according to a predetermined initial expansion factor, subjecting each expanded detection sub-slab to deformation detection using the first fast spin echo sequence, and determining the position of each imaging sub-slab of the current slab and an expansion factor corresponding to each imaging sub-slab, wherein the readout gradient of the first fast spin echo sequence is applied in the direction of the slice selection gradient, expanding the encoded thickness of each imaging sub-slab of the current slab of the imaging region on the basis of the determined position of each imaging sub-slab and the corresponding expansion factor, and performing an
(Continued)

imaging scan of each expanded imaging sub-slab using a second fast spin echo sequence.

12 Claims, 6 Drawing Sheets

(56) References Cited

U.S. PATENT DOCUMENTS

| | | | | |
|---|---|---|---|---|
| 6,011,392 | A | * | 1/2000 | Zhou ................ G01R 33/56554 |
| | | | | 324/307 |
| 6,150,815 | A | * | 11/2000 | Janzen .................. B82Y 25/00 |
| | | | | 324/307 |
| 2004/0140802 | A1 | | 7/2004 | Zhang |
| 2006/0122487 | A1 | * | 6/2006 | Tatebayashi ........... A61B 5/055 |
| | | | | 600/410 |
| 2011/0237931 | A1 | | 9/2011 | Kumai et al. |
| 2013/0076356 | A1 | * | 3/2013 | Jellus .................. A61B 5/7217 |
| | | | | 324/309 |
| 2013/0169275 | A1 | * | 7/2013 | Li ...................... G01R 33/4818 |
| | | | | 324/309 |

FOREIGN PATENT DOCUMENTS

| | | |
|---|---|---|
| CN | 101144853 A | 3/2008 |
| CN | 101162262 A | 4/2008 |
| CN | 101846731 A | 9/2010 |
| CN | 102238909 A | 11/2011 |
| JP | H09234188 A | 9/1997 |
| JP | 2007312959 A | 12/2007 |
| JP | 2009268891 A | 11/2009 |
| WO | 2011021106 A2 | 2/2011 |
| WO | WO 2012054768 A1 | 4/2012 |

OTHER PUBLICATIONS

Lu W et al "SEMAC Slice Encoding for Metal Artifact Correction in MRI", Magnetic Resonance in Medicine 62, pp. 66-76, 2009, 2009.

Koch et al , "A Multispectral Three-Dimensional Acquisition Technique for Imaging Near Metal Implants", Magnetic Resonance in Medicine 61 381-390 (2009), 2009.

Koch et al , "Z-Selective Multi-Spectral 3D Imaging a MAVRIC-SEMAC Hybrid", ISMRM, p. 139, 2010, 2010.

* cited by examiner

Legend
901: Deformation Detection Module
902: Imaging Scan Module
1001: First Sub-slab Partitioning Sub-module
1002: First Slice Deformation Detection Sub-module
1003: First Expansion Factor Calculation Sub-module
1004: First Result Determination Sub-module

Legend:
1101: Second Sub-slab Partitioning Sub-module
1102: Second Slice Deformation Detection Sub-module
1103: Second Expansion Factor Calculation Sub-module
1104: Sub-slab Adjustment Sub-module
1105: Second Result Determination Module
1201: First Expansion Sub-module
1202: First Imaging Scan Sub-module
1301: Second Expansion Sub-module
1302: Second Imaging Scan Sub-module

MAGNETIC RESONANCE IMAGING METHOD AND MAGNETIC RESONANCE IMAGING APPARATUS THAT COMPENSATE FOR SLAB DISTORTION BY SELECTIVE SLAB THICKNESS EXPANSION

CROSS REFERENCE TO RELATED APPLICATIONS

This application claims priority of Chinese Patent Office application No. 20110454045.2 CN filed Dec. 30, 2011. All of the applications are incorporated by reference herein in their entirety.

TECHNICAL FIELD

A magnetic resonance imaging method and magnetic resonance imaging device are provided.

BACKGROUND ART

Magnetic resonance imaging is a technique for performing imaging using the phenomenon of magnetic resonance. The principles of magnetic resonance imaging mainly include: in an atomic nucleus containing a single proton, such as the hydrogen nuclei which are present throughout the human body, the proton thereof has spin motion and so resembles a small magnet. The spin axes of these small magnets have no fixed pattern; if an external magnetic field is applied, the small magnets will realign in accordance with the lines of magnetic force, specifically aligning in a direction parallel to a line of magnetic force of the external magnetic field, or in a direction antiparallel to a line of magnetic force of the external magnetic field. The direction parallel to a line of magnetic force of the external magnetic field is called the positive longitudinal axis, while the direction antiparallel to a line of magnetic force of the external magnetic field is called the negative longitudinal axis; a nucleus has only a longitudinal component of magnetization, this longitudinal component of magnetization having both a direction and a magnitude. Nuclei in the external magnetic field are excited using a Radio Frequency (RF) pulse of a specific frequency, such that the spin axes of these nuclei deviate from the positive longitudinal axis or negative longitudinal axis, resulting in resonance; this is the phenomenon of magnetic resonance. Once the spin axes of the excited nuclei have deviated from the positive longitudinal axis or negative longitudinal axis, the nuclei have a transverse component of magnetization.

Once emission of the RF pulse has stopped, the excited nuclei emit an echo signal, gradually releasing the absorbed energy in the form of an electromagnetic wave, and the phase and energy level thereof return to their pre-excitation states; by subjecting the echo signals emitted by the nuclei to further processing, such as spatial encoding, an image can be reconstructed.

Figure 1A:
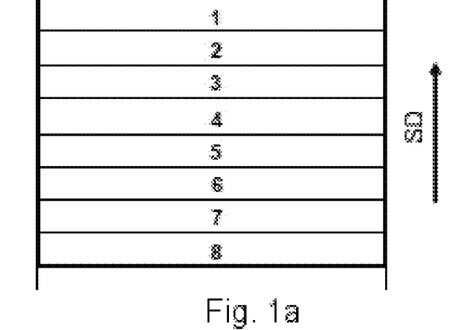
FIG. 1a is a schematic diagram showing partitioning of sub-slabs.
Figure 1B:
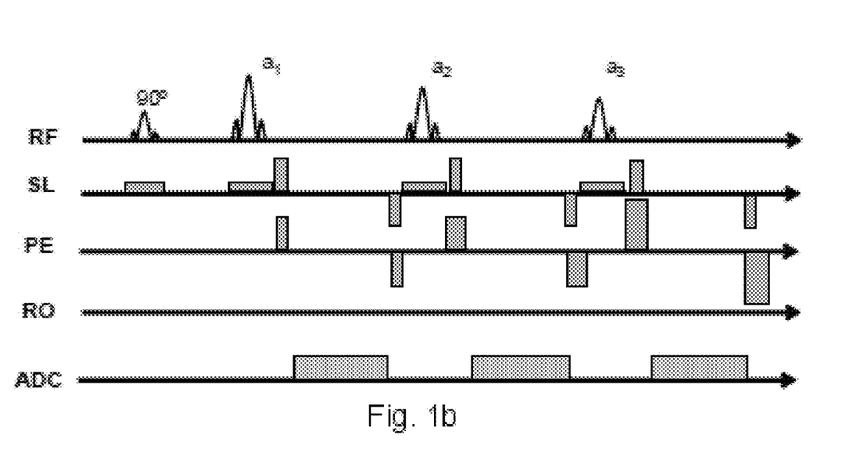
FIG. 1b is a schematic diagram showing partial encoding of the sub-slabs.
Figure 1C:
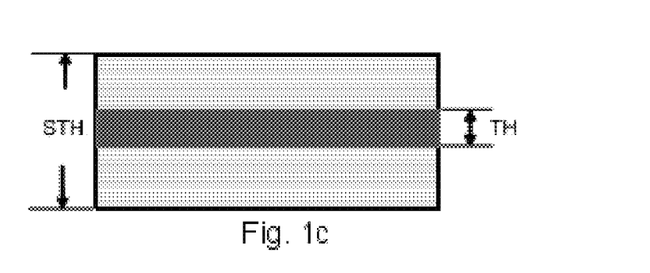
FIG. 1c is a schematic diagram showing the relationship between the excited layer thickness and expanded layer thickness for each sub-slab.

FIGS. 1a to 1c show schematic diagrams of a type of multi-slab image encoding based on a 3D fast spin echo sequence. FIG. 1a is a schematic diagram showing partitioning of sub-slabs; FIG. 1b is a schematic diagram showing partial encoding of the sub-slabs; FIG. 1c is a schematic diagram showing the relationship between the excited layer thickness and expanded layer thickness for each sub-slab.

As FIG. 1a shows, each slab of the imaging region is first divided into multiple sub-slabs in the slice direction; the case of 8 sub-slabs is taken as an example in FIG. 1a. An imaging scan is then performed on each sub-slab using 3D fast spin echoes.

One slice encoding step during specific encoding and imaging is shown in FIG. 1b, in which RF, SL (Slice), PE (Phase Encoding), RO (Readout) and ADC (analog-digital converter) correspond to radio frequency pulse, slice selection gradient, encoding gradient, readout gradient and data acquisition module, respectively. The method comprises: emitting a sequence of pulses of different angles within a repetition time TR, at the same time varying the phase encoding gradient with a certain slice encoding gradient, so as to fill one slice encoded k-space; within another repetition time TR, the RF pulses remain unchanged and the slice encoding gradient is changed, giving another slice encoded k-space; and so on until data for the whole k-space is collected. In the pulse sequence, one 90 degree selective exciting pulse is applied first, a slice selection gradient corresponding to the current sub-slab being applied in the SL direction at the same time. One a1-degree selective inverting RF pulse is then emitted; at the same time, a slice selection gradient corresponding to the current sub-slab and a slice encoding gradient are applied in the SL direction, a first encoding gradient is applied in the PE direction, and the ADC is then used to perform data acquisition. One a2-degree selective inverting RF pulse is then emitted; at the same time, a slice selection gradient corresponding to the current sub-slab and a slice encoding gradient are applied in the SL direction, a second encoding gradient is applied in the PE direction, and the ADC is then used to perform data acquisition, and so on until data for the whole k-space is collected.

During the imaging process, expansion must be performed in accordance with a predetermined expansion factor on either side of the sub-slab slice direction, so as to obtain a slice encoded thickness greater than the excited thickness, encoding being performed on the slice thickness corresponding to this encoded thickness. As shown in FIG. 1c, the thickness TH corresponding to the middle shaded region of FIG. 1c is the excited thickness of the current sub-slab, while the thickness STH corresponding to the whole region of FIG. 1c is the slice encoded thickness of the current sub-slab. The excited thickness is generally equal to the thickness of the corresponding sub-slab. The expansion factors corresponding to each sub-slab are generally equal.

Figure 2:
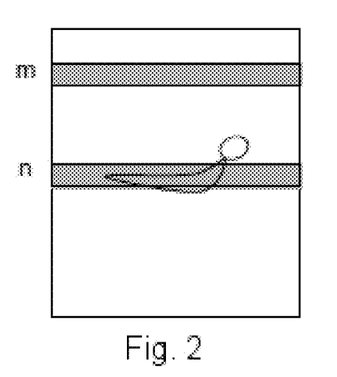
FIG. 2 is a schematic diagram showing the positions of sub-slabs relative to a metal implant.

Since a metal implant (MI) may be implanted inside a living body for the purpose of securing or replacing a joint or other vital tissue during orthopedic surgery and other emergency operations, in practical applications the presence of a metal insert will give rise to inhomogeneity in the external magnetic field, leading to geometric distortion of the image. For each sub-slab, this geometric distortion is mainly embodied in slice deformation of the excited sub-slab, the slice deformation corresponding to an excited sub-slab being different for different distances between the excited sub-slab and the metal implant. In the schematic diagram of FIG. 2, showing the positions of sub-slabs relative to a metal implant MI, the slice deformation of the $n^{th}$ sub-slab, which is closer to the metal implant MI, is greater than that of the $m^{th}$ sub-slab, which is remote from the metal implant MI.

Furthermore, different types of metal implant give rise to different slice deformations in an excited sub-slab. If the same expansion factor is used to expand the encoded thickness for each sub-slab, full acquisition of the image data arising from the slice deformation of each excited sub-slab is not possible, so the distorted image cannot be restored fully during the image reconstruction stage.

SUMMARY OF INVENTION

In view of the above, a magnetic resonance imaging method and a magnetic resonance imaging device are proposed, for fully acquiring and restoring a distorted image, to further improve image quality.

A magnetic resonance imaging method provided in accordance with an embodiment comprises:

dividing the current slab of an imaging region into an initial number of detection sub-slabs, and expanding the encoded thickness of each detection sub-slab according to a predetermined initial expansion factor;

subjecting each expanded detection sub-slab to deformation detection using a first fast spin echo sequence, and determining the position of each imaging sub-slab of the current slab and an expansion factor corresponding to each imaging sub-slab on the basis of a deformation detection result, wherein the readout gradient of the first fast spin echo sequence is applied in the direction of the slice selection gradient;

expanding the encoded thickness of each imaging sub-slab of the current slab of the imaging region on the basis of the determined position of each imaging sub-slab and the corresponding expansion factor;

performing an imaging scan of each expanded imaging sub-slab using a second fast spin echo sequence.

Optionally, the step of subjecting each expanded detection sub-slab to deformation detection using a first fast spin echo sequence, and determining the position of each imaging sub-slab of the current slab and an expansion factor corresponding to each imaging sub-slab on the basis of a deformation detection result comprises:

subjecting the current expanded detection sub-slab to deformation detection using a first fast spin echo sequence, to obtain a slice deformation $\Delta$;

based on the relationships
$\Delta = \Delta 1 - \Delta 2$, $$\frac{\Delta 1}{\Delta 2} = a\frac{GS_{ro}}{GS_{ss}} \text{ and } f = \frac{\Delta 1}{TH},$$

obtaining the expansion factor $$f = \frac{\Delta}{\left(1 - \frac{GS_{ss}}{aGS_{ro}}\right)TH}$$

corresponding to the detection sub-slab, wherein $\Delta 1$ is the excitation deformation, $\Delta 2$ is the readout gradient deformation, $GS_{ro}$ is the amplitude of the readout gradient applied in the direction of the slice selection gradient, $GS_{SS}$ is the amplitude of the slice selection gradient, a is a coefficient determined on the basis of the excited thickness, the size of the imaging region covered by the applied readout gradient, and the size of the resolution of the readout gradient in the direction of the slice selection gradient, and TH is the excited thickness;

taking the position corresponding to each detection sub-slab of the current slab as the position of each imaging sub-slab of the current slab, and taking the expansion factor obtained for each detection sub-slab as the expansion factor of the imaging sub-slab corresponding thereto.

Optionally, the step of subjecting each expanded detection sub-slab to deformation detection using a first fast spin echo sequence, and determining the position of each imaging sub-slab of the current slab and an expansion factor corresponding to each imaging sub-slab on the basis of a deformation detection result comprises:

A. subjecting the current expanded detection sub-slab to deformation detection using a first fast spin echo sequence, to obtain a slice deformation $\Delta$;

B. based on the relationships
$\Delta = \Delta 1 - \Delta 2$, $$\frac{\Delta 1}{\Delta 2} = a\frac{GS_{ro}}{GS_{ss}} \text{ and } f = \frac{\Delta 1}{TH},$$

obtaining the expansion factor $$f = \frac{\Delta}{\left(1 - \frac{GS_{ss}}{aGS_{ro}}\right)TH}$$

corresponding to the detection sub-slab, wherein $\Delta 1$ is the excitation deformation, $\Delta 2$ is the readout gradient deformation, $GS_{ro}$ is the amplitude of the readout gradient applied in the direction of the slice selection gradient, $GS_{SS}$ is the amplitude of the slice selection gradient, a is a coefficient determined on the basis of the excited thickness, the size of the imaging region covered by the applied readout gradient, and the size of the resolution of the readout gradient in the direction of the slice selection gradient, and TH is the excited thickness;

C. keeping the encoded thickness of each detection sub-slab the same, adjusting the excited thickness of each detection sub-slab according to the obtained expansion factor corresponding to each detection sub-slab, and adjusting the current number of detection sub-slabs of the current slab and the position corresponding to each detection sub-slab according to the adjusted excited thickness of each detection sub-slab;

D. if the current number is equal to the initial number, taking the newly determined position corresponding to each detection sub-slab of the current slab as the position of each imaging sub-slab of the current slab, and taking the expansion factor obtained for each detection sub-slab as the expansion factor of the imaging sub-slab corresponding thereto; otherwise, taking the current number as an initial number, dividing the current slab into an initial number of detection sub-slabs according to the newly determined positions corresponding to each detection sub-slab of the current slab, expanding the encoded thickness of each newly added detection sub-slab according to a predetermined initial expansion factor, expanding the encoded thickness of existing detection sub-slabs after adjustment according to each obtained expansion factor, and returning to step A.

Optionally, the step of expanding the encoded thickness of each imaging sub-slab of the current slab of the imaging region on the basis of the determined position of each imaging sub-slab and the corresponding expansion factor comprises:

expanding each imaging sub-slab symmetrically on either side of the slice selection direction of the imaging sub-slab according to the expansion factor corresponding to the imaging sub-slab; or expanding each imaging sub-slab asymmetrically on either side of the slice selection direction of the imaging sub-slab according to the expansion factor corresponding to the imaging sub-slab and an excitation deformation direction corresponding to the expansion factor.

Optionally, the first fast spin echo sequence is a one-dimensional or a two-dimensional fast spin echo sequence.

Optionally, the second fast spin echo sequence is a two-dimensional or a three-dimensional fast spin echo sequence.

A magnetic resonance imaging device provided in accordance with another embodiment comprises:

a deformation detection module, for dividing the current slab of an imaging region into an initial number of detection sub-slabs, expanding the encoded thickness of each detection sub-slab according to a predetermined initial expansion factor, subjecting each expanded detection sub-slab to deformation detection using a first fast spin echo sequence, and determining the position of each imaging sub-slab of the current slab and an expansion factor corresponding to each imaging sub-slab on the basis of a deformation detection result, wherein the readout gradient of the first fast spin echo sequence is applied in the direction of the slice selection gradient;

an imaging scan module, for expanding the encoded thickness of each imaging sub-slab of the current slab of the imaging region on the basis of the position of each imaging sub-slab and the expansion factor corresponding to each imaging sub-slab as determined by the deformation detection module, and performing an imaging scan of each expanded imaging sub-slab using a second fast spin echo sequence.

Optionally, the deformation detection module comprises:

a first sub-slab partitioning sub-module, for dividing the current slab of an imaging region into an initial number of detection sub-slabs, and expanding the encoded thickness of each detection sub-slab according to a predetermined initial expansion factor;

a first slice deformation detection sub-module, for subjecting each expanded detection sub-slab to deformation detection using a first fast spin echo sequence, to obtain a slice deformation Δ;

a first expansion factor calculation sub-module, for obtaining the expansion factor $$f = \frac{\Delta}{\left(1 - \frac{GS_{ss}}{aGS_{ro}}\right)TH}$$

corresponding to the detection sub-slab on the basis of the relationships Δ=Δ1−Δ2, $$\frac{\Delta 1}{\Delta 2} = a\frac{GS_{ro}}{GS_{ss}} \text{ and } f = \frac{\Delta 1}{TH},$$

wherein Δ1 is the excitation deformation, Δ2 is the readout gradient deformation, $GS_{ro}$ is the amplitude of the readout gradient applied in the direction of the slice selection gradient, $GS_{SS}$ is the amplitude of the slice selection gradient, a is a coefficient determined on the basis of the excited thickness, the size of the imaging region covered by the applied readout gradient, and the size of the resolution of the readout gradient in the direction of the slice selection gradient, and TH is the excited thickness;

a first result determination sub-module, for taking the position corresponding to each detection sub-slab of the current slab as the position of each imaging sub-slab of the current slab, and taking the expansion factor obtained for each detection sub-slab as the expansion factor of the imaging sub-slab corresponding thereto.

Optionally, the deformation detection module comprises:

a second sub-slab partitioning sub-module, for dividing the current slab of an imaging region into an initial number of detection sub-slabs, and expanding the encoded thickness of each detection sub-slab according to a predetermined initial expansion factor;

a second slice deformation detection sub-module, for subjecting each expanded detection sub-slab to deformation detection using a first fast spin echo sequence, to obtain a slice deformation Δ;

a second expansion factor calculation sub-module, for obtaining the expansion factor $$f = \frac{\Delta}{\left(1 - \frac{GS_{ss}}{aGS_{ro}}\right)TH}$$

corresponding to the detection sub-slab on the basis of the relationships Δ=Δ1−Δ2, $$\frac{\Delta 1}{\Delta 2} = a\frac{GS_{ro}}{GS_{ss}} \text{ and } f = \frac{\Delta 1}{TH},$$

wherein Δ1 is the excitation deformation, Δ2 is the readout gradient deformation, $GS_{ro}$ is the amplitude of the readout gradient applied in the direction of the slice selection gradient, $GS_{SS}$ is the amplitude of the slice selection gradient, a is a coefficient determined on the basis of the excited thickness, the size of the imaging region covered by the applied readout gradient, and the size of the resolution of the readout gradient in the direction of the slice selection gradient, and TH is the excited thickness;

a sub-slab adjustment sub-module, for keeping the encoded thickness of each detection sub-slab the same, adjusting the excited thickness of each detection sub-slab according to the obtained expansion factor corresponding to each detection sub-slab, and adjusting the current number of detection sub-slabs of the current slab and the position corresponding to each detection sub-slab according to the adjusted excited thickness of each detection sub-slab;

a second result determination sub-module, for taking the newly determined position corresponding to each detection sub-slab of the current slab as the position of each imaging sub-slab of the current slab, and taking the expansion factor obtained for each detection sub-slab as the expansion factor of the imaging sub-slab corresponding thereto, when the current number is equal to the initial number; otherwise, taking the current number as an initial number, dividing the current slab of the imaging region into the current number of detection sub-slabs according to the newly determined positions corresponding to each detection sub-slab of the current slab, expanding the encoded thickness of each newly added detection sub-slab according to a predetermined initial expansion factor, expanding the encoded thickness of existing detection sub-slabs after adjustment according to each obtained expansion factor, and advising the slice deformation detection module to subject the currently partitioned detection sub-slabs to slice detection.

Optionally, the imaging scan module comprises: a first expansion sub-module and an imaging scan sub-module;

alternatively, it comprises: a second expansion sub-module and an imaging scan sub-module;

the first expansion sub-module is used for expanding each imaging sub-slab symmetrically on either side of the slice selection direction of the imaging sub-slab according to the expansion factor corresponding to the imaging sub-slab;

the second expansion sub-module is used for expanding each imaging sub-slab asymmetrically on either side of the slice selection direction of the imaging sub-slab according to the expansion factor corresponding to the imaging sub-slab and an excitation deformation direction corresponding to the expansion factor;

the imaging scan sub-module is used for performing an imaging scan of each expanded imaging sub-slab using a second fast spin echo sequence.

It can be seen from the above solution that in the embodiments, full acquisition and restoration of a distorted image is possible, because the current slab of the imaging region is divided into a plurality of detection sub-slabs before being subjected to an imaging scan, each detection sub-slab is then subjected to deformation detection so as to finally obtain the expansion factors corresponding to each encoded sub-slab of the current slab, and the expansion factors corresponding to each encoded sub-slab are then used to subject each encoded sub-slab to encoded thickness expansion and an imaging scan in a targeted way.

Furthermore, when the encoded thickness of each imaging sub-slab is expanded using the expansion factor corresponding thereto, asymmetrical expansion can be performed on either side of the slice selection direction of the imaging sub-slab according to an excitation deformation direction corresponding to the deformation detection time, thereby ensuring that the distorted image can be fully acquired and restored, and further improving image quality.

BRIEF DESCRIPTION OF THE DRAWINGS

Embodiments will be described in detail below with reference to the accompanying drawings, so as to furnish those skilled in the art with a clearer understanding of the above and other features and advantages; in the drawings:

FIGS. 1a to 1c are schematic diagrams of a type of multi-slab image encoding based on a 3D fast spin echo sequence.

FIG. 5a is a schematic diagram of slice deformation; FIG. 5b is a schematic diagram of the excitation deformation; FIG. 5c is a schematic diagram of the readout gradient deformation.

FIGS. 6a and 6b are schematic diagrams showing the encoded thickness corresponding to different sub-slabs when the excited thickness is kept unchanged in the embodiments.

FIGS. 7a and 7b are schematic diagrams showing the excited thickness corresponding to different sub-slabs when the encoded thickness is kept unchanged in the embodiments.

FIGS. 8a and 8b are schematic diagrams showing a method for expanding the encoded thickness of a sub-slab using an expansion factor in the embodiments.

In the drawings, the reference labels are as follows:
SD—slice direction TH—excited thickness STH—encoded thickness
RF—radio frequency pulse SL—slice selection gradient
PE—encoding gradient RO—readout gradient
ADC—data acquisition module
m—$m^{th}$ sub-slab n—$n^{th}$ sub-slab
DD—deformation direction Δ—slice deformation
Δ1—excitation deformation
Δ2—readout gradient deformation
301—sub-slab partitioning 302—deformation detection
303—encoding expansion 304—imaging scan
901—deformation detection module
902—imaging scan module
1001—first sub-slab partitioning sub-module
1002—first slice deformation detection sub-module
1003—first expansion factor calculation sub-module
1004—first result determination sub-module
1101—second sub-slab partitioning sub-module
1102—second slice deformation detection sub-module
1103—second expansion factor calculation sub-module
1104—sub-slab adjustment sub-module
1105—second result determination module
1201—first expansion sub-module
1202—first imaging scan sub-module
1301—second expansion sub-module
1302—second imaging scan sub-module In view of the fact that the slice deformation corresponding to an excited sub-slab varies with the distance of the excited sub-slab from a metal implant, and the fact that different types of metal implant cause different slice deformations of excited sub-slabs, in order to fully acquire and restore a distorted image in the embodiments, each sub-slab of the current slab of the imaging region is subjected to deformation detection before an imaging scan of the current sub-slab is performed, so as to obtain a slice deformation value corresponding to each sub-slab; a suitable expansion factor corresponding to the sub-slab is then obtained based on the slice deformation value, and encoded thickness expansion is then performed in a targeted way using the expansion factor corresponding to each sub-slab.

The embodiments are described in further detail below by way of examples, in order to clarify the object, technical solution and advantages thereof.

Figure 3:
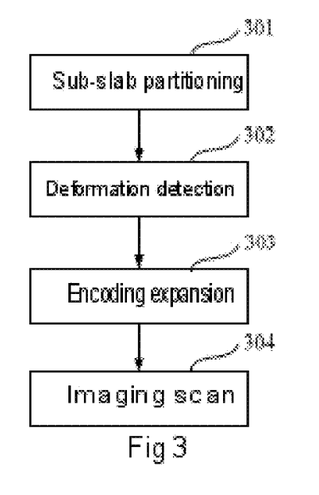
FIG. 3 is an illustrative flow chart of the magnetic resonance imaging method in the embodiments.

FIG. 3 is an illustrative flow chart of the magnetic resonance imaging method in the embodiments. As FIG. 3 shows, the method comprises the following steps:

Step 301, dividing the current slab of an imaging region into an initial number of detection sub-slabs, and expanding the encoded thickness of each detection sub-slab according to a predetermined initial expansion factor.

The specific implementation process of this step can be the same as the process of sub-slab partitioning and encoding thickness expansion during an imaging scan in the prior art. Alternatively, the initial number and initial expansion factor in this step may also be determined on the basis of empirical values or simulated values, etc.

Step 302, subjecting each expanded detection sub-slab to deformation detection using a first fast spin echo sequence, and determining the position of each imaging sub-slab of the current slab and an expansion factor corresponding to each imaging sub-slab on the basis of a deformation detection result.

Figure 4:
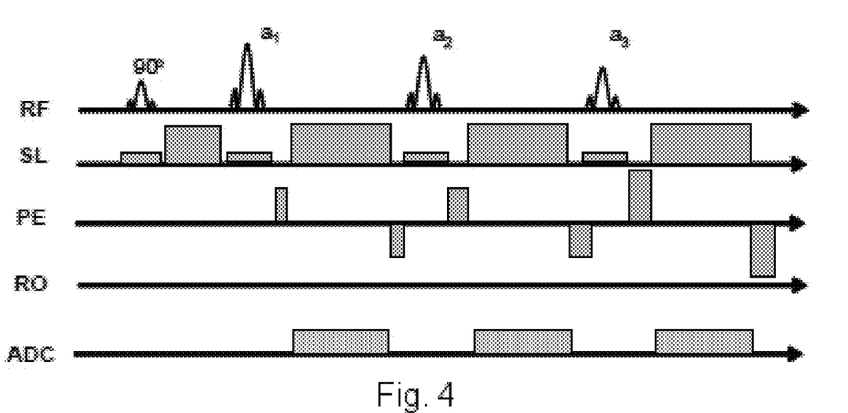
FIG. 4 is a schematic diagram of one slice encoding step during deformation detection in the embodiments.

In this embodiment, the readout gradient of the first fast spin echo sequence is applied in the direction of the slice selection gradient rather than in the readout gradient direction. This is shown in FIG. 4, which shows a schematic diagram of one slice encoding step during deformation detection in this embodiment. As can be seen, in this pulse sequence a 90-degree selective excitation pulse is applied first, a slice selection gradient corresponding to the current sub-slab and a phase pre-dispersion gradient being applied in the SL direction at the same time. An al-degree selective inverting RF pulse is then emitted; at the same time, a slice selection gradient corresponding to the current sub-slab and a readout gradient are applied in the SL direction, a first encoding gradient is applied in the PE direction, and the ADC is then used to perform data acquisition. An a2-degree selective inverting RF pulse is then emitted; at the same time, a slice selection gradient corresponding to the current sub-slab and a readout gradient are applied in the SL direction, a second encoding gradient is applied in the PE direction, and the ADC is then used to perform data acquisition, and so on until data for the whole k-space is collected. As can be seen, in this sequence the readout gradient is moved from the RO direction to the SL direction, so the sequence is a two-dimensional fast spin echo sequence. During practical application, a one-dimensional fast spin echo sequence may also be used to subject each sub-slab to deformation detection; for instance, the sequence shown in FIG. 4 may be turned into a one-dimensional fast spin echo sequence simply by removing the encoding gradient in the PE direction.

During particular implementation, many particular embodiments of this step are possible, two of which are given below:

First embodiment: the encoded thickness is adjusted on the basis of the result of deformation detection. In particular, this may comprise:

1) Subjecting the current expanded detection sub-slab to deformation detection using a first fast spin echo sequence, to obtain a slice deformation Δ.

Figure 5A:
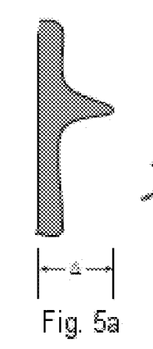
FIGS. 5a to 5c are schematic diagrams of slice deformation and the excitation deformation and readout gradient deformation corresponding thereto in the embodiments.
Figure 5B:
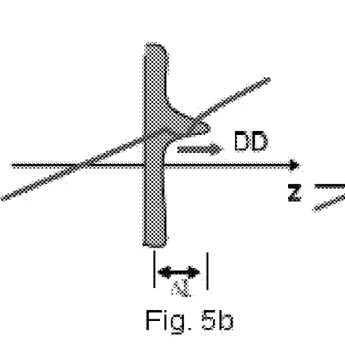
Figure 5C:
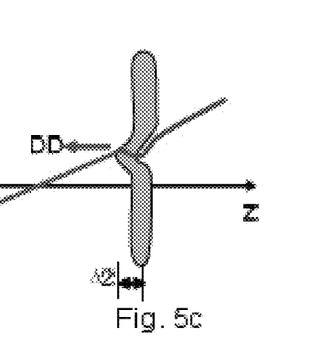

In step 1), when the current expanded detection sub-slab is subjected to deformation detection using a first fast spin echo sequence, the slice deformation Δ may be measured, as shown in FIG. 5a. FIGS. 5a to 5c are schematic diagrams of slice deformation and the excitation deformation and readout gradient deformation corresponding thereto in the embodiments. In fact, the slice deformation Δ includes deformation information in two parts, these being the excitation deformation Δ1 shown in FIG. 5b and the readout gradient deformation Δ2 shown in FIG. 5c, the three quantities satisfying the relation Δ=Δ1−Δ2. The excitation deformation Δ1 and the readout gradient deformation Δ2 have different deformation directions and in general cannot be obtained directly.

2) Based on the relationships Δ=Δ1−Δ2, $$\frac{\Delta 1}{\Delta 2} = a\frac{GS_{ro}}{GS_{ss}} \text{ and } f = \frac{\Delta 1}{TH},$$

obtaining the expansion factor $$f = \frac{\Delta}{\left(1 - \frac{GS_{ss}}{aGS_{ro}}\right)TH}$$

corresponding to the detection sub-slab, wherein $GS_{ro}$ is the amplitude of the readout gradient applied in the direction of the slice selection gradient, $GS_{SS}$ is the amplitude of the slice selection gradient, a is a coefficient determined on the basis of the excited thickness, the size of the imaging region covered by the applied readout gradient, and the size of the resolution of the readout gradient in the direction of the slice selection gradient, TH is the excited thickness, and f is the expansion factor.

The amplitude $GS_{ro}$ of the readout gradient applied in the direction of the slice selection gradient, the amplitude $GS_{SS}$ of the slice selection gradient, the coefficient a and the excited thickness TH can all be obtained in advance.

3) Taking the position corresponding to each detection sub-slab of the current slab as the position of each imaging sub-slab of the current slab, and taking the expansion factor obtained for each detection sub-slab as the expansion factor of the imaging sub-slab corresponding thereto.

Figure 6A:
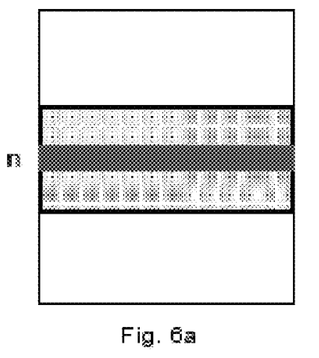
FIG. 6a is a schematic diagram showing the encoded thickness corresponding to a sub-slab that is closer to a metal implant.
Figure 6B:
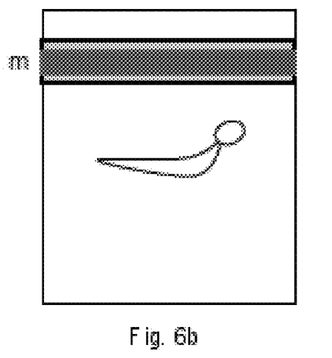
FIG. 6b is a schematic diagram showing the encoded thickness corresponding to a sub-slab that is further away from the metal implant.

In this particular embodiment, the main point is that the number of sub-slabs and the excited thicknesses thereof are kept the same, so that the partitioning of sub-slabs of the current slab during the imaging scan is the same as the partitioning of sub-slabs during deformation detection; however, when the encoded thickness of each encoded sub-slab is expanded in step 303, expansion is performed separately according to the different expansion factors corresponding to each encoding sub-slab, so that the encoded thickness of each sub-slab during the imaging scan is different from the encoded thickness of each sub-slab during deformation detection. FIGS. 6a and 6b are schematic diagrams showing the encoded thickness corresponding to different sub-slabs when the excited thickness is kept unchanged in the embodiments. As FIG. 6a shows, since the slice deformation is greater for the $n^{th}$ sub-slab that is closer to the metal implant MI, the corresponding expansion factor is greater; when the encoded thickness of this sub-slab is expanded using this expansion factor, a greater encoded thickness is obtained. As FIG. 6b shows, since the slice deformation is smaller for the $m^{th}$ sub-slab that is further away from the metal implant MI, the corresponding expansion factor is smaller; when the encoded thickness of this sub-slab is expanded using this expansion factor, a smaller encoded thickness is obtained.

Second embodiment: the excited thickness is adjusted on the basis of the result of deformation detection. In particular, this may comprise:

A. Subjecting the current expanded detection sub-slab to deformation detection using a first fast spin echo sequence, to obtain a slice deformation $\Delta$.

B. Based on the relationships $\Delta = \Delta 1 - \Delta 2$, $$\frac{\Delta 1}{\Delta 2} = a \frac{GS_{ro}}{GS_{ss}} \text{ and } f = \frac{\Delta 1}{TH},$$

obtaining the expansion factor $$f = \frac{\Delta}{\left(1 - \frac{GS_{ss}}{aGS_{ro}}\right)TH}$$

corresponding to the detection sub-slab, wherein $\Delta 1$ is the excitation deformation, $\Delta 2$ is the readout gradient deformation, $GS_{ro}$ is the amplitude of the readout gradient applied in the direction of the slice selection gradient, $GS_{SS}$ is the amplitude of the slice selection gradient, a is a coefficient determined on the basis of the excited thickness, the size of the imaging region covered by the applied readout gradient, and the size of the resolution of the readout gradient in the direction of the slice selection gradient, and TH is the excited thickness.

C. Keeping the encoded thickness of each detection sub-slab the same, adjusting the excited thickness of each detection sub-slab according to the obtained expansion factor corresponding to each detection sub-slab, and adjusting the current number of detection sub-slabs of the current slab and the position corresponding to each detection sub-slab according to the adjusted excited thickness of each detection sub-slab.

Figure 7A:
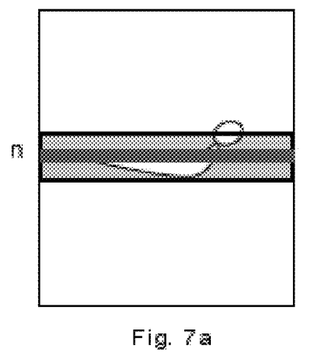
FIG. 7a is a schematic diagram showing the excited thickness corresponding to a sub-slab that is close to a metal implant.
Figure 7B:
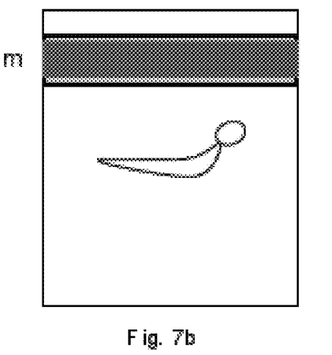
FIG. 7b is a schematic diagram showing the excited thickness corresponding to a sub-slab that is remote from the metal implant.

During practical application, the encoded thickness typically corresponds to a certain slice encoding step, so that keeping the encoded thickness of each detection sub-slab the same is equivalent to keeping the total number of encoding steps of each detection sub-slab the same, in which case the adjusted excited thickness $TH_j$ can be determined according to the relation $TH_j = N_j/f_j$ in order to fully acquire and restore the distorted image. $N_j$ is the total number of encoding steps of the $j^{th}$ detection sub-slab, $f_j$ is the expansion factor corresponding to the $j^{th}$ detection sub-slab, and $TH_j$ is the adjusted excited thickness of the $j^{th}$ detection sub-slab. FIGS. 7a and 7b are schematic diagrams showing the excited thickness corresponding to different sub-slabs when the encoded thickness is kept unchanged in the embodiments. As FIG. 7a shows, since the slice deformation is greater for the $n^{th}$ sub-slab that is closer to the metal implant MI, the corresponding expansion factor is greater; when the encoded thickness is kept the same and the excited thickness of the sub-slab is adjusted using this expansion factor, a smaller excited thickness is obtained. As FIG. 7b shows, since the slice deformation is smaller for the $m^{th}$ sub-slab that is further away from the metal implant MI, the corresponding expansion factor is smaller; when the encoded thickness is kept the same and the excited thickness of the sub-slab is adjusted using this expansion factor, a greater excited thickness is obtained.

Since the excited thickness is equal to the thickness of the detection sub-slab, once the excited thickness is adjusted, the thickness and position of the detection sub-slab will change accordingly. In this way, the partitioning of sub-slabs in the current slab will change, and it is possible that new detection sub-slabs will need to be added; correspondingly, the number of detection sub-slabs may also change.

D. Judging whether the current number is equal to the initial number. If it is, step E is performed; otherwise, step F is performed.

If the current number is equal to the initial number, then the number of expansion factors is equal to the current number of adjusted sub-slabs, in which case step E may be performed; otherwise, the number of expansion factors is different from the current number of adjusted sub-slabs, and it is necessary to perform deformation detection again to make the two numbers equal.

E. Taking the newly determined position corresponding to each detection sub-slab of the current slab as the position of each imaging sub-slab of the current slab, and taking the expansion factor obtained for each detection sub-slab as the expansion factor of the imaging sub-slab corresponding thereto.

F. Taking the current number as an initial number, dividing the current slab into an initial number of detection sub-slabs according to the newly determined positions corresponding to each detection sub-slab of the current slab, expanding the encoded thickness of each newly added detection sub-slab according to a predetermined initial expansion factor, expanding the encoded thickness of existing detection sub-slabs after adjustment according to each obtained expansion factor, and returning to step A.

Step 303, expanding the encoded thickness of each imaging sub-slab of the current slab of the imaging region on the basis of the determined position of each imaging sub-slab and the corresponding expansion factor.

In this step, for each imaging sub-slab, the expansion factor corresponding thereto is used to expand the encoded thickness thereof. Since different slice deformations correspond to different expansion factors, each sub-slab can be expanded to a different encoded thickness according to actual requirements, so as to fully acquire and restore the distorted image.

Figure 8A:
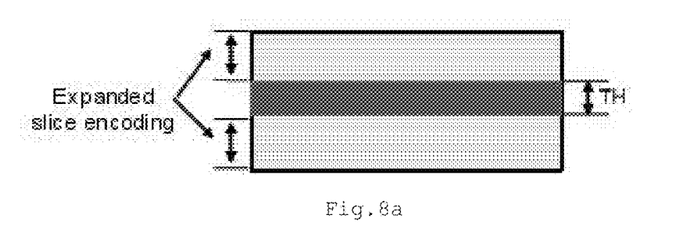
FIG. 8a is a schematic diagram showing a sub-slab being subjected to symmetric expansion.
Figure 8B:
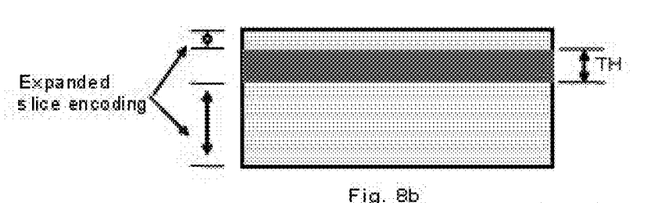
FIG. 8b is a schematic diagram showing a sub-slab being subjected to asymmetric expansion.

During practical application, when the expansion factor corresponding to each imaging sub-slab is used to expand the encoded thickness thereof, symmetric or asymmetric expansion may be performed on either side of the slice selection direction of the imaging sub-slab. For instance, based on the direction of excitation deformation corresponding to each expansion factor during deformation detection, greater expansion may be performed on the excitation deformation direction side, and lesser expansion on the other side; the specific ratio of expansions on the two sides can be determined on the basis of the specific result of deformation detection. FIGS. 8a and 8b are schematic diagrams showing a method for expanding the encoded thickness of a sub-slab using an expansion factor in the embodiments. FIG. 8a is a schematic diagram showing a sub-slab being subjected to symmetric expansion; FIG. 8b is a schematic diagram showing a sub-slab being subjected to asymmetric expansion.

Step 304, performing an imaging scan of each expanded imaging sub-slab using a second fast spin echo sequence.

In this step, the second fast spin echo sequence can be a two-dimensional fast spin echo sequence or a three-dimensional fast spin echo sequence.

Figure 9:
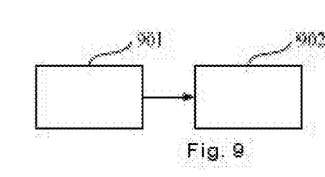
FIG. 9 is an illustrative structural diagram of a magnetic resonance imaging device in the embodiments.

FIG. 9 is an illustrative structural diagram of a magnetic resonance imaging device in the embodiments. As FIG. 9 shows, the magnetic resonance imaging device comprises: a deformation detection module 901 and an imaging scan module 902.

The deformation detection module 901 is used for dividing the current slab of an imaging region into an initial number of detection sub-slabs, expanding the encoded thickness of each detection sub-slab according to a predetermined initial expansion factor, subjecting each expanded detection sub-slab to deformation detection using a first fast spin echo sequence, and determining the position of each imaging sub-slab of the current slab and an expansion factor corresponding to each imaging sub-slab on the basis of a deformation detection result. In this embodiment, the readout gradient of the first fast spin echo sequence is applied in the direction of the slice selection gradient rather than in the readout gradient direction.

The imaging scan module 902 is used for expanding the encoded thickness of each imaging sub-slab of the current slab of the imaging region on the basis of the position of each imaging sub-slab and the expansion factor corresponding to each imaging sub-slab as determined by the deformation detection module, and performing an imaging scan of each expanded imaging sub-slab using a second fast spin echo sequence.

During specific implementation, many particular embodiments of the deformation detection module 901 are possible. Only two such embodiments are given below.

Figure 10:
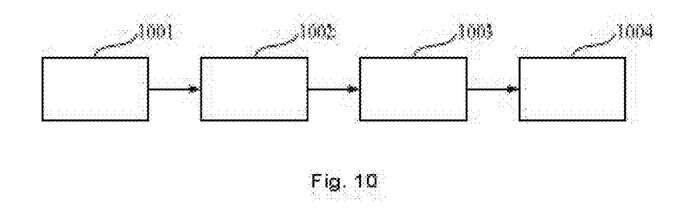
FIG. 10 is a structural schematic diagram of a deformation detection module in the embodiments.

FIG. 10 is a structural schematic diagram of a deformation detection module in this embodiment. As FIG. 10 shows, the deformation detection module comprises: a first sub-slab partitioning sub-module 1001, a first slice deformation detection sub-module 1002, a first expansion factor calculation sub-module 1003 and a first result determination sub-module 1004.

The first sub-slab partitioning sub-module 1001 is used for dividing the current slab of an imaging region into an initial number of detection sub-slabs, and expanding the encoded thickness of each detection sub-slab according to a predetermined initial expansion factor.

The first slice deformation detection sub-module 1002 is used for subjecting each expanded detection sub-slab to deformation detection using a first fast spin echo sequence, to obtain a slice deformation $\Delta$.

The first expansion factor calculation sub-module 1003 is used for obtaining the expansion factor $$f = \frac{\Delta}{\left(1 - \frac{GS_{ss}}{aGS_{ro}}\right)TH}$$

corresponding to the detection sub-slab on the basis of the relationships $\Delta=\Delta1-\Delta2$, $$\frac{\Delta 1}{\Delta 2} = a\frac{GS_{ro}}{GS_{ss}} \text{ and } f = \frac{\Delta 1}{TH}.$$

Here, $\Delta1$ is the excitation deformation, $\Delta2$ is the readout gradient deformation, $GS_{ro}$ is the amplitude of the readout gradient applied in the direction of the slice selection gradient, $GS_{SS}$ is the amplitude of the slice selection gradient, a is a coefficient determined on the basis of the excited thickness, the size of the imaging region covered by the applied readout gradient, and the size of the resolution of the readout gradient in the direction of the slice selection gradient, and TH is the excited thickness.

The first result determination sub-module 1004 is used for taking the position corresponding to each detection sub-slab of the current slab as the position of each imaging sub-slab of the current slab, and taking the expansion factor obtained for each detection sub-slab as the expansion factor of the imaging sub-slab corresponding thereto.

Figure 11:
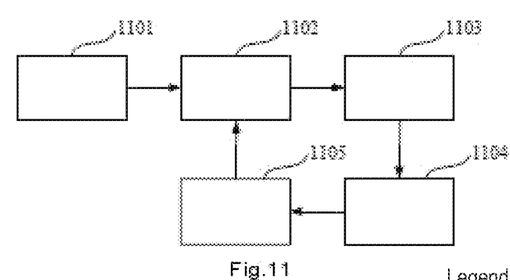
FIG. 11 is another structural schematic diagram of a deformation detection module in the embodiments.

FIG. 11 is another structural schematic diagram of a deformation detection module in this embodiment. As FIG. 11 shows, the deformation detection module comprises: a second sub-slab partitioning sub-module 1101, a second slice deformation detection sub-module 1102, a second expansion factor calculation sub-module 1103, a sub-slab adjustment sub-module 1104 and a second result determination sub-module 1105.

The second sub-slab partitioning sub-module 1101 is used for dividing the current slab of an imaging region into an initial number of detection sub-slabs, and expanding the encoded thickness of each detection sub-slab according to a predetermined initial expansion factor.

The second slice deformation detection sub-module 1102 is used for subjecting each expanded detection sub-slab to deformation detection using a first fast spin echo sequence, to obtain a slice deformation $\Delta$.

The second expansion factor calculation sub-module 1103 is used for obtaining the expansion factor $$f = \frac{\Delta}{\left(1 - \frac{GS_{ss}}{aGS_{ro}}\right)TH}$$

corresponding to the detection sub-slab on the basis of the relationships $\Delta=\Delta1-\Delta2$, $$\frac{\Delta 1}{\Delta 2} = a\frac{GS_{ro}}{GS_{ss}} \text{ and } f = \frac{\Delta 1}{TH},$$

Here, $\Delta1$ is the excitation deformation, $\Delta2$ is the readout gradient deformation, $GS_{ro}$ is the amplitude of the readout gradient applied in the direction of the slice selection gradient, $GS_{SS}$ is the amplitude of the slice selection gradient, a is a coefficient determined on the basis of the excited thickness, the size of the imaging region covered by the applied readout gradient, and the size of the resolution of the readout gradient in the direction of the slice selection gradient, and TH is the excited thickness.

The sub-slab adjustment sub-module 1104 is used for keeping the encoded thickness of each detection sub-slab the same, adjusting the excited thickness of each detection sub-slab according to the obtained expansion factor corresponding to each detection sub-slab, and adjusting the current number of detection sub-slabs of the current slab and the position corresponding to each detection sub-slab according to the adjusted excited thickness of each detection sub-slab.

The second result determination sub-module 1105 is used for taking the newly determined position corresponding to each detection sub-slab of the current slab as the position of each imaging sub-slab of the current slab, and taking the expansion factor obtained for each detection sub-slab as the expansion factor of the imaging sub-slab corresponding thereto, when the current number is equal to the initial number; otherwise, taking the current number as an initial number, dividing the current slab of the imaging region into the current number of detection sub-slabs according to the newly determined positions corresponding to each detection sub-slab of the current slab, expanding the encoded thickness of each newly added detection sub-slab according to a predetermined initial expansion factor, expanding the encoded thickness of existing detection sub-slabs after adjustment according to each obtained expansion factor, and advising the slice deformation detection module to subject the currently partitioned detection sub-slabs to slice detection.

During specific implementation, many particular embodiments of the imaging scan module 902 are possible. Only two such embodiments are given below.

Figure 12:
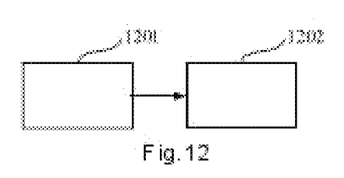
FIG. 12 is a structural schematic diagram of an imaging scan module in the embodiments.

FIG. 12 is a structural schematic diagram of an imaging scan module in this embodiment. As FIG. 12 shows, the imaging scan module comprises: a first expansion sub-module 1201 and a first imaging scan sub-module 1202.

The first expansion sub-module 1201 is used for expanding each imaging sub-slab symmetrically on either side of the slice selection direction of the imaging sub-slab according to the expansion factor corresponding to the imaging sub-slab.

The first imaging scan sub-module 1202 is used for performing an imaging scan of each expanded imaging sub-slab using a second fast spin echo sequence.

Figure 13:
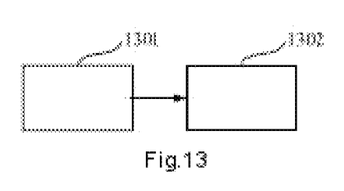
FIG. 13 is another structural schematic diagram of an imaging scan module in the embodiments.

FIG. 13 is another structural schematic diagram of an imaging scan module in this embodiment. As FIG. 13 shows, the imaging scan module comprises: a second expansion sub-module 1301 and a second imaging scan sub-module 1302.

The second expansion sub-module 1301 is used for expanding each imaging sub-slab asymmetrically on either side of the slice selection direction of the imaging sub-slab according to the expansion factor corresponding to the imaging sub-slab and an excitation deformation direction corresponding to the expansion factor.

The second imaging scan sub-module 1302 is used for performing an imaging scan of each expanded imaging sub-slab using a second fast spin echo sequence.

Those skilled in the art should appreciate that each accompanying drawing is merely a schematic diagram of a preferred embodiment, and that modules or procedures in the drawings are not necessarily required for implementation.

Those skilled in the art should appreciate that the modules in the device in an embodiment may be distributed in the device of the embodiment according to the description of the embodiment, or be changed accordingly and located in one or more devices different from this embodiment. Modules in the above embodiments may be combined to form one module, or be split further to form multiple sub-modules.

Some of the steps in the embodiments may be implemented using software, with corresponding software programs stored in a readable storage medium such as a CD or hard disk.

A magnetic resonance imaging method and magnetic resonance imaging device are disclosed. The magnetic resonance imaging method comprises: dividing the current slab of an imaging region into an initial number of detection sub-slabs, and expanding the encoded thickness of each detection sub-slab according to a predetermined initial expansion factor; subjecting each expanded detection sub-slab to deformation detection using a first fast spin echo sequence, and determining the position of each imaging sub-slab of the current slab and an expansion factor corresponding to each imaging sub-slab, wherein the readout gradient of the first fast spin echo sequence is applied in the direction of the slice selection gradient; expanding the encoded thickness of each imaging sub-slab of the current slab of the imaging region on the basis of the determined position of each imaging sub-slab and the corresponding expansion factor; and performing an imaging scan of each expanded imaging sub-slab using a second fast spin echo sequence. The embodiments are capable of fully acquiring and restoring a distorted image.

We claim:

1. A magnetic resonance (MR) imaging method, comprising:
providing a computer with a designation of a current slab of an examination subject from which MR data are to be acquired, said subject exhibiting a slab-distorting source;
utilizing said computer in order to divide said current slab into an initial number of detection sub-slabs, each having thickness, according to a predetermined initial expansion factor, thereby producing a plurality of expanded detection sub-slabs;
utilizing said computer in order to operate an MR data acquisition scanner comprising a radio-frequency (RF) radiator and a gradient coil arrangement, while the examination subject is in the MR data acquisition scanner, in order to perform a first fast spin echo sequence in which a readout gradient is activated by said gradient coil arrangement in a same direction as a slice selection gradient, so as to obtain a detection MR dataset from each of the expanded detection sub-slabs, each of the expanded detection sub-slabs having a sub-slab thickness represented in the detection MR dataset thereof, each sub-slab thickness having two thickness parameters consisting of an excitation thickness, in which nuclear spins in the respective detection sub-slabs were excited by said RF radiator, and an encoding thickness, produced from encoding by said readout gradient;
utilizing said computer to determine a position of each expanded detection sub-slab relative to the slab-distorting source of the subject;
utilizing said computer to expand each respective expanded detection sub-slab according to said position of the respective expanded detection sub-slab relative to said slab-distorting source of the subject, and said pre-determined initial expansion factor, by expanding one of said two thickness parameters while keeping the other of said two thickness parameters unchanged, thereby producing a plurality of diagnostic sub-slabs;
utilizing said computer to operate said MR data acquisition scanner in order to perform a second fast spin echo sequence so as to acquire diagnostic MR data from each of said diagnostic sub-slabs; and
in said computer, reconstructing MR image data for each of said diagnostic sub-slabs respectively obtained from the acquired diagnostic MR data from each of said diagnostic sub-slabs and emitting the reconstructed MR image data from the computer in electronic form in a data file.

2. The method as claimed in claim 1 comprising utilizing said computer in order to determine the position of each expanded detection sub-slab relative to the slab-distorting source by calculating, for each respective expanded detection sub-slab, a slice deformation $\Delta$ according to $\Delta = \Delta 1 - \Delta 2$, $$\frac{\Delta 1}{\Delta 2} = a\frac{GS_{ro}}{GS_{ss}} \text{ and } f = \frac{\Delta 1}{TH},$$

in order to obtain an expansion factor F for each respective expanded detection sub-slab, wherein $$f = \frac{\Delta}{\left(1 - \frac{GS_{ss}}{aGS_{ro}}\right)TH}$$

wherein Δ1 is a deformation resulting from excitation of the respective sub-slabs, Δ2 is a deformation due to said readout gradient, $GS_{ro}$ is an amplitude of the readout gradient applied in the direction of the slice gradient, $GS_{SS}$ is an amplitude of the slice selection gradient, TH is said sub-slab thickness, and a is a coefficient determined in said computer based on TH, a size of an imaging region covered by the applied readout gradient, and a resolution of the readout gradient.

3. The method as claimed in claim 2 comprising:
utilizing said computer in order to set said sub-slab thickness TH of each detection sub-slab, while keeping a total thickness of each detection sub-slab equal, according to the expansion factor for each detection sub-slab, and adjusting a number of said detection sub-slabs, and the respective positions thereof, according to the adjusted thickness of each detection sub-slab; and
when a current number of said detection sub-slabs is equal to said initial number, utilizing the position of each detection sub-slab as the position of each diagnostic sub-slab, and using the expansion factor of each detection sub-slab as the expansion factor of each diagnostic sub-slab, and when said current number is not equal to said initial number, using said current number as the initial number and dividing the current slab into said initial number of detection sub-slabs according to said positions, and expanding a thickness of each sub-slab according to a predetermined initial expansion factor.

4. The method as claimed in claim 1 comprising utilizing said computer in order to expand each detection sub-slab symmetrically on opposite sides of the direction of the slice selection gradient, or in order to expand each expanded detection sub-slab asymmetrically on opposite sides of the direction of the slice selection gradient.

5. The method as claimed in claim 1 comprising utilizing said computer to operate said MR data acquisition scanner in order to perform said first fast spin echo sequence as a one-dimensional fast spin echo sequence or a two-dimensional fast spin echo sequence.

6. The method as claimed in claim 1 comprising utilizing said computer to operate said MR data acquisition scanner in order to perform said second fast spin echo sequence as a one-dimensional fast spin echo sequence or a two-dimensional fast spin echo sequence.

7. A magnetic resonance (MR) imaging apparatus comprising:
an MR data acquisition scanner comprising a radio-frequency (RF) radiator and a gradient coil arrangement;
a computer provided with a designation of a current slab of an examination subject from which MR data are to be acquired, said subject exhibiting a slab-distorting source therein;
said computer being configured to divide said current slab into an initial number of detection sub-slabs, each having thickness, according to a predetermined initial expansion factor, thereby producing a plurality of expanded detection sub-slabs;
said computer being configured to operate an MR data acquisition scanner, while the examination subject is in the MR data acquisition scanner, in order to perform a first fast spin echo sequence in which a readout gradient is activated by said gradient coil arrangement in a same direction as a slice selection gradient, so as to obtain a detection MR dataset from each of the expanded detection sub-slabs, each of the expanded detection sub-slabs having a sub-slab thickness represented in the detection MR dataset thereof, each sub-slab thickness having two thickness parameters consisting of an excitation thickness, in which nuclear spins in the respective detection sub-slabs were excited by said RF radiator, and an encoding thickness, produced from encoding by said readout gradient;
said computer being configured to determine a position of each expanded detection sub-slab relative to the slab-distorting source of the subject;
said computer being configured to expand each respective expanded detection sub-slab according to said position of the respective expanded detection sub-slab relative to said slab-distorting source of the subject, and said pre-determined initial expansion factor, by expanding one of said two thickness parameters while keeping the other of said two thickness parameters unchanged, thereby producing a plurality of diagnostic sub-slabs;
said computer being configured to operate said MR data acquisition scanner in order to perform a second fast spin echo sequence so as to acquire diagnostic MR data from each of said diagnostic sub-slabs; and
said computer being configured to reconstruct MR image data for each of said diagnostic sub-slabs respectively obtained from the acquired diagnostic MR data from each of said diagnostic sub-slabs and to emit the reconstructed MR image data from the computer in electronic form as a data file.

8. The apparatus as claimed in claim 7 wherein said computer is configured to determine the position of each expanded detection sub-slab relative to the slab-distorting source by calculating, for each respective expanded detection sub-slab, a slice deformation Δ according to Δ=Δ1−2, $$\frac{\Delta 1}{\Delta 2} = a \frac{GS_{ro}}{GS_{ss}} \text{ and } f = \frac{\Delta 1}{TH},$$

in order to obtain an expansion factor F for each respective expanded detection sub-slab, wherein $$f = \frac{\Delta}{\left(1 - \frac{GS_{ss}}{aGS_{ro}}\right)TH}$$

wherein Δ1 is a deformation resulting from excitation of the respective sub-slabs, Δ2 is a deformation due to said readout gradient, $GS_{ro}$ is an amplitude of the readout gradient applied in the direction of the slice gradient, $GS_{SS}$ is an amplitude of the slice selection gradient, TH is said sub-slab thickness, and a is a coefficient determined in said computer based on TH, a size of an imaging region covered by the applied readout gradient, and a resolution of the readout gradient.

9. The apparatus as claimed in claim 8 wherein:
said computer is configured to set said sub-slab thickness TH of each detection sub-slab, while keeping a total thickness of each detection sub-slab equal, according to the expansion factor of each detection sub-slab, and adjusting a number of said detection sub-slabs, and the respective positions thereof, according to the adjusted thickness of each detection sub-slab; and when a current number of said detection sub-slabs is equal to said initial number, utilizing the position of each detection sub-slab as the position of each diagnostic sub-slab, and using the expansion factor for each detection sub-slab as the expansion factor of each diagnostic sub-slab, and when said current number is not equal to said initial number, using said current number as the initial number and dividing the current slab into said initial number of detection sub-slabs according to said positions, and expanding a thickness of each sub-slab according to a predetermined initial expansion factor.

10. The apparatus as claimed in claim 7 wherein said computer is configured to expand each detection sub-slab symmetrically on opposite sides of the direction of the slice selection gradient, or to expand each expanded detection sub-slab asymmetrically on opposite sides of the direction of the slice selection gradient.

11. The apparatus as claimed in claim 7 wherein said computer is configured to operate said MR data acquisition scanner in order to perform said first fast spin echo sequence as a one-dimensional fast spin echo sequence or a two-dimensional fast spin echo sequence.

12. The apparatus as claimed in claim 7 wherein said computer is configured to operate said MR data acquisition scanner in order to perform said second fast spin echo sequence as a one-dimensional fast spin echo sequence or a two-dimensional fast spin echo sequence.

\* \* \* \* \*